United States Patent [19]

Ferry et al.

[11] 4,096,400

[45] Jun. 20, 1978

[54] INDUCTIVE LOAD DRIVING AMPLIFIER

[75] Inventors: Michel Francois M. S. Ferry, Vallauris; Daniel Francois Reynes, Villeneuve-Loubet, both of France

[73] Assignee: International Business Machines Corporation, Armonk, N.Y.

[21] Appl. No.: 788,094

[22] Filed: Apr. 15, 1977

[30] Foreign Application Priority Data

May 21, 1976 France .................................. 76 16128

[51] Int. Cl.² ............................................ H03K 17/60
[52] U.S. Cl. .................................. 307/254; 307/270; 361/111
[58] Field of Search ............... 307/254, 237, 300, 255, 307/302, 270; 361/111

[56] References Cited

U.S. PATENT DOCUMENTS

| 3,112,431 | 11/1963 | Pederson | 307/254 X |
| 3,872,327 | 3/1975 | Rudert et al. | 307/254 X |
| 3,896,317 | 7/1975 | Alcorn et al. | 307/254 |

*Primary Examiner*—James B. Mullins
*Attorney, Agent, or Firm*—John E. Hoel

[57] ABSTRACT

An inductive load driving amplifier is disclosed which includes two serially connected transistors, with Zener diodes limiting the collector-emitter voltage of the one and diverting the collector-base current of the other when the first one switches off. The driver is implemented as an integrated circuit. This collector isolation constitutes a high voltage Zener diode which contributes to limit the collector voltages. The combination of these features prevents the device from being exposed to second breakdown when switching highly inductive loads (e.g. several Henrys under 50V), thereby avoiding the harmful effects of breakdowns during switching.

1 Claim, 2 Drawing Figures 4,096,400

INDUCTIVE LOAD DRIVING AMPLIFIER

FIELD OF THE INVENTION

This invention relates to a transistorized power amplifier and, more particularly, to an amplifier for driving an inductive load which, more specifically, can be a relay coil.

BACKGROUND OF THE INVENTION

The transient phenomena which appear when turning the power on or off for an inductive load such as a relay coil, raise important problems when the driving circuits are comprised of transistors. Indeed, the overvoltages caused by self-inductance effects and, more specifically, those caused when turning the power off, may entail the breakdown of the transistors included in the circuit. It can easily be understood that these problems are even more critical when the circuit elements are to be implemented in integrated circuit technology. The purpose of the subject invention, therefore, is to provide structures which avoid these phenomena which cause transistor breakdowns.

Many solutions have already been proposed to solve these problems, which are more or less complex and unreliable. In those solutions, one drawback is that only comparatively low power supplies (12 volts, for instance) can be used.

OBJECTS OF THE INVENTION

Therefore, an object of this invention is to provide for a relatively simple and reliable inductive load driving circuit which can be advantageously embodied in integrated circuit technology while making it possible to feed inductive loads under comparatively high voltages.

SUMMARY

These and other objects, features and advantages of the invention are accomplished by the inductive load driving amplifier invention which includes two serially connected transistors, with Zener diodes limiting the collector-emitter voltage of the one and diverting the collector-base current of the other when the first one switches off. The driver is implemented as an integrated circuit. The collector isolation constitutes a high voltage Zener diode which contributes to limit the collector voltages. The combination of these features prevents the device from being exposed to second breakdown when switching highly inductive loads (e.g. several Henrys at 50V).

DESCRIPTION OF THE FIGURES

This invention can be further understood by way of a non-limitative example, with reference to the accompanying drawings, in which.

DISCUSSION OF THE PREFERRED EMBODIMENT

As mentioned above, the transient phenomena which appear when powering on and, more particularly, when powering off an inductive load circuit, may cause the breakdown of the circuit. In those situations, the elements which are most adversely affected are those transistors which may be broken down owing to overvoltages or to avalanche effects in the transistors, i.e. the so-called secondary breakdowns. Indeed, when electric current is accumulated in a limited area of the base of the transistor to be turned off, this brings about a local temperature rise and the thermal disturbance which creates the avalanche effect which may cause the breakdown of the base-emitter junction of the transistor. These deteriorations will be avoided, here, by providing diversion paths for diverting harmful electric charges and distributing overvoltages over a plurality of transistors. To this end, transistor characteristics will be employed, wherein the breakdown of the collector-base junction of a transistor having its emitter unconnected, is higher than the breakdown voltage of the collector-base junction of a transistor having its base unconnected.

The circuit of this invention is comprised of at least two transistors, which are series-connected in the feeding path of the inductive charge, a means for controlling the off operation of the transistor the more remotely positioned from this load thereby helping to turn off the following series-connected transistor in the circuit, and a means for completing the turning off this last transistor through the creation of a path for diverting its base current.

Figure 1:
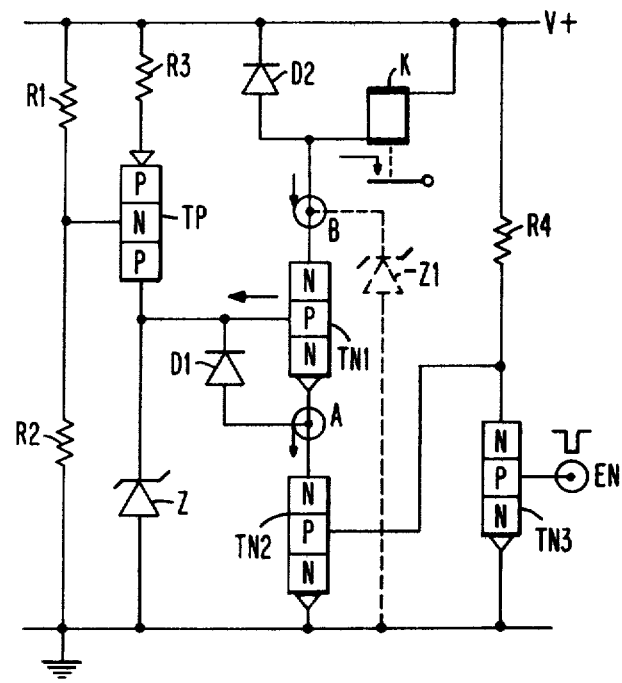
FIG. 1 is a preferred embodiment of this invention.

FIG. 1 illustrates a preferred embodiment of the circuit according to this invention. The inductive load, here is a relay coil K. It is fed through a circuit comprised of two series-connected NPN transistors TN1 and TN2. The coil is mounted between positive terminal V+ of the power supply and the collector of TN1. The emitter of TN1 is connected to the collector of TN2 the emitter of which is grounded. The base of TN1 is fed by a current generator TP formed of a PNP transistor, and a voltage divider formed of two resistors R1 and R2 supplying a constant reference voltage to the base of TP. A load resistor R3 mounted between V+ and the emitter of TP makes it possible to limit the current to the base of TN1 and to at least one referenced power supply, e.g. a Zener diode Z, the second electrode of which is grounded. The control signal for powering on/off coil K, i.e. for controlling the conducting, non-conducting states of TN1-TN2 is applied to the base of TN2, either directly or through amplifier (TN3, R4). Finally, two diodes D1 and D2 are mounted, one between the emitter and the base of TN1, the other one at the terminals of coil K. They are not absolutely necessary, but, as it will be seen later, they are utilized to improve the qualities of the circuit and make the operation thereof more reliable.

At first, since the voltage applied to the base of transistor TN3 is positive, the latter is conducting, and the voltage at the base of TN2, then is grounded; TN2 is non-conducting and coil K is not fed. When causing TN3 to be non-conducting through a voltage drop at the base thereof, this very transistor has its collector potential increased as well as the base potential of TN2. TN2, then tends to be conducting and, since the base of TN1 is receiving the current from generator TP, transistors TN1, TN2 are conducting and feed coil K. When the relay must not be fed any more, TN3 is turned on anew upon application of a positive voltage to input EN. The potential applied to the base of TN2 is lowered and tends to block the same. The potential at point A tends to go up to voltage Vz from which value the Zener diode Z becomes conducting (in practice, a plurality of Zener diodes may be series-connected in order to set Vz to an adequate value). As the Zener diode becomes conducting, a low impedance current sink is created which draws the current from generator TP and from the base of TN1 while TN2 is opposing to the emitter current of TN1. Otherwise, the current flowing from the collector to the emitter of TN1 would tend to be accumulated in a portion of the transistor base, thereby generating the above-mentioned thermo-electronic avalanche effect which would cause the breakdown of transistor TN1.

Therefore, it has been seen that series-connected plurality of transistors in the inductive load feeding circuit, in combination with the creation of a low impedance reference voltage at the base of the transistor(s) immediately adjacent to this load, prevents the circuit from being broken down because of extra breakdown currents when the load stops being fed.

Other elements have been added to the circuit shown in FIG. 1 for improved operation. First, a diode D1 limits the inverse voltage pulse in the base-emitter junction of TN1 which could be transmitted through a capacitive effect. This diode is useful only when the circuit operating conditions, and more specifically when the inverse current in the base of TN1 and the lateral resistance of the same, are such that the breakdown voltage in the base-emitter junction of this transistor may possibly be reached.

In another case, the use of diode D1 should be avoided since it reduces the switching rate of the circuit and increases the power dissipation of TN1.

Figure 2:
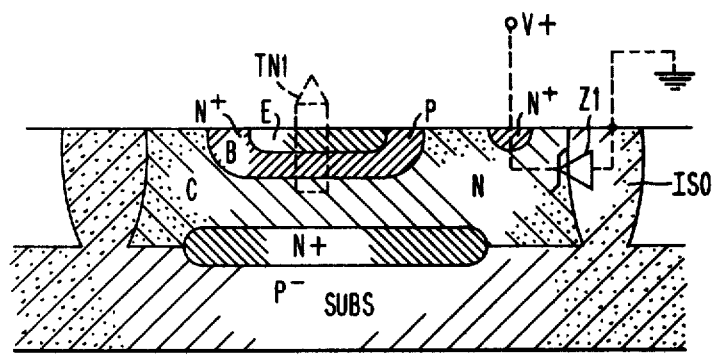
FIG. 2 is the schematic diagram of the integrated circuit corresponding to one portion of the circuit shown in FIG. 1.

Second, a diode D2 has been added between the collector of TN1 and therminal V+ of the power supply in order to prevent any overvoltage from appearing on this collector. As a matter of fact, this overvoltage is already limited as an effective Zener diode Z1 is inherently present in the integrated circuit of transistor TN1. Reference to FIG. 2, it will facilitate an understanding of the phenomenon causing the presence of this diode Z1. This Figure is a conventional schematic illustration of an NPN transistor in a substrate SUBS containing a plurality of elements isolated from one another by areas ISO. Each of these elements is, therefore, in an isolated pocket in the epitaxial layer (it should be noted that the drawing shows also a buried N type subcollector layer highly doped (N+) which is intended to reduce the resistance in the collector of transistor TN1). Highly doped P type isolation walls delimiting the isolation pocket of TN1 are formed through a diffusion process. Then, the P type slightly doped base area, the P type highly doped emitter area and the contact collector area are also diffused in a conventional way. The NP area formed between the epitaxial layer and the subcollector, on the one hand, and the substrate and the isolation wall ISO, on the other hand, act as the diode Z1. Since this diode is backward biased, it operates as a Zener diode.

While the invention has been particularly shown and described with reference to the preferred embodiments thereof, it will be understood by those skilled in the art that the foregoing and other changes in form and details may be made therein without departing from the spirit and scope of the invention.

We claim:

1. A transistorized power amplifier intended to drive an inductive load, comprising:
   a first and a second series-connected NPN type transistor in the feeding path of said load;
   a current generator driving the base of said first transistor,
   means for driving the base of said second transistor so as to control the "on" and "off" turning operations of the series-mounted circuit intended to feed said load;
   means for creating a low-impedance reference voltage source which short-circuits the base current of said first transistor when said second transistor is turned off;
   a Zener diode between the collector of said first transistor and ground;
   whereby an inductive load may be driven without suffering avalanche breakdown.

* * * * *